US010262746B2

(12) United States Patent
Chen et al.

(10) Patent No.: US 10,262,746 B2
(45) Date of Patent: Apr. 16, 2019

(54) NONVOLATILE MEMORY STRUCTURE

(71) Applicant: eMemory Technology Inc., Hsinchu (TW)

(72) Inventors: Ying-Je Chen, Taichung (TW); Wei-Ren Chen, Pingtung County (TW); Wein-Town Sun, Taoyuan (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 15/252,244

(22) Filed: Aug. 31, 2016

(65) Prior Publication Data

US 2017/0207228 A1 Jul. 20, 2017

Related U.S. Application Data

(60) Provisional application No. 62/280,683, filed on Jan. 19, 2016.

(51) Int. Cl.
*H01L 27/115* (2017.01)
*G11C 16/04* (2006.01)
(Continued)

(52) U.S. Cl.
CPC .............. *G11C 16/30* (2013.01); *G11C 7/065* (2013.01); *G11C 7/10* (2013.01); *G11C 7/12* (2013.01); *G11C 7/22* (2013.01); *G11C 8/10* (2013.01); *G11C 16/0408* (2013.01); *G11C 16/0433* (2013.01); *G11C 16/0458* (2013.01); *G11C 16/08* (2013.01); *G11C 16/10* (2013.01);
(Continued)

(58) Field of Classification Search
None
See application file for complete search history.

(56) References Cited

U.S. PATENT DOCUMENTS 5,592,001 A    1/1997  Asano
7,768,059 B2   8/2010  Chen et al.
(Continued)

OTHER PUBLICATIONS

Liou et al., "Characterization of process-induced mobile ions on the data retention in flash memory," IEEE Transactions on Electron Devices, Jun. 25, 2003, pp. 995-100.
(Continued)

*Primary Examiner* — Abul Kalam
(74) *Attorney, Agent, or Firm* — JCIPRNET

(57) ABSTRACT

A nonvolatile memory structure includes a first PMOS transistor and a first floating-gate transistor on a first active region in a substrate, a second PMOS transistor and a second floating-gate transistor on a second active region in the substrate, and an n-type erase region in the substrate. A source line connects with sources of the first and the second PMOS transistors. A bit line connects with drains of the first and the second floating-gate transistors. A word line connects with first and the second select gates in the first and the second PMOS transistors respectively. An erase line connects with the n-type erase region. The first floating-gate transistor includes a first floating gate with an extended portion extending on a first portion of the n-type erase region. The second floating-gate transistor includes a second floating gate with an extended portion extending on a second portion of the n-type erase region.

24 Claims, 11 Drawing Sheets

(51) Int. Cl.

| | | |
|---|---|---|
| *G11C 16/30* | (2006.01) | |
| *G11C 16/12* | (2006.01) | |
| *G11C 16/14* | (2006.01) | |
| *G11C 16/26* | (2006.01) | |
| *H01L 27/11558* | (2017.01) | |
| *G11C 16/10* | (2006.01) | |
| *G11C 16/16* | (2006.01) | |
| *H01L 27/11521* | (2017.01) | |
| *H01L 27/11526* | (2017.01) | |
| *G11C 7/10* | (2006.01) | |
| *G11C 7/12* | (2006.01) | |
| *G11C 7/22* | (2006.01) | |
| *G11C 16/08* | (2006.01) | |
| *G11C 16/24* | (2006.01) | |
| *H01L 23/528* | (2006.01) | |
| *H01L 27/02* | (2006.01) | |
| *H01L 27/11517* | (2017.01) | |
| *G11C 7/06* | (2006.01) | |
| *G11C 8/10* | (2006.01) | |
| *H01L 27/11524* | (2017.01) | |
| *H01L 27/12* | (2006.01) | |
| *H01L 29/06* | (2006.01) | |
| *H01L 29/08* | (2006.01) | |
| *H01L 29/10* | (2006.01) | |
| *H01L 29/423* | (2006.01) | |
| *H01L 27/11519* | (2017.01) | |

(52) U.S. Cl.
CPC .............. *G11C 16/12* (2013.01); *G11C 16/14* (2013.01); *G11C 16/16* (2013.01); *G11C 16/24* (2013.01); *G11C 16/26* (2013.01); *H01L 23/528* (2013.01); *H01L 27/0207* (2013.01); *H01L 27/11517* (2013.01); *H01L 27/11519* (2013.01); *H01L 27/11521* (2013.01); *H01L 27/11524* (2013.01); *H01L 27/11526* (2013.01); *H01L 27/11558* (2013.01); *H01L 27/1203* (2013.01); *H01L 29/0649* (2013.01); *H01L 29/0847* (2013.01); *H01L 29/1095* (2013.01); *H01L 29/42328* (2013.01)

(56) References Cited

U.S. PATENT DOCUMENTS

| | | | |
|---|---|---|---|
| 8,351,254 B2 * | 1/2013 | Taniguchi | G11C 16/0433 257/315 |
| 8,363,470 B2 | 1/2013 | Tailliet | |
| 8,994,092 B2 * | 3/2015 | Yamakoshi | H01L 27/11524 257/316 |
| 9,196,363 B2 * | 11/2015 | Yamakoshi | G11C 16/0441 |
| 9,390,799 B2 * | 7/2016 | Chih | G11C 11/5621 |
| 9,425,204 B2 * | 8/2016 | Ching | H01L 29/7881 |
| 9,633,729 B2 * | 4/2017 | Ching | H01L 29/7881 |
| 9,646,979 B2 * | 5/2017 | Taniguchi | G11C 16/0441 |
| 9,666,279 B2 * | 5/2017 | Ching | H01L 29/7881 |
| 2003/0235082 A1 | 12/2003 | Hsu et al. | |
| 2005/0029577 A1 * | 2/2005 | Nishizaka | G11C 16/0458 257/315 |
| 2007/0007575 A1 * | 1/2007 | Ding | H01L 21/28273 257/314 |
| 2009/0159946 A1 | 6/2009 | Huang et al. | |
| 2010/0329016 A1 * | 12/2010 | Taniguchi | G11C 16/0433 365/185.18 |
| 2011/0116324 A1 * | 5/2011 | Haggag | G11C 16/0433 365/185.29 |
| 2011/0176368 A1 * | 7/2011 | Kalnitsky | G11C 16/0433 365/185.18 |
| 2013/0075803 A1 * | 3/2013 | Edrei | H01L 29/788 257/315 |
| 2013/0286729 A1 * | 10/2013 | Chih | G11C 11/5621 365/181 |
| 2015/0092498 A1 * | 4/2015 | Ching | H01L 29/7881 365/185.23 |
| 2015/0311219 A1 * | 10/2015 | Taniguchi | G11C 16/0441 257/300 |
| 2016/0035421 A1 * | 2/2016 | Ching | H01L 29/7881 365/185.1 |
| 2016/0307629 A1 * | 10/2016 | Ching | H01L 29/7881 |

OTHER PUBLICATIONS

"Search Report of Europe Counterpart Application", dated May 30, 2017, p. 1-p. 10.

* cited by examiner

NONVOLATILE MEMORY STRUCTURE

CROSS-REFERENCE TO RELATED APPLICATION

This application claims the priority benefit of U.S. provisional application Ser. No. 62/280,683, filed on Jan. 19, 2016. The entirety of the above-mentioned patent application is hereby incorporated by reference herein and made a part of this specification.

BACKGROUND OF THE INVENTION

1. Field of the Invention

The present invention generally relates to a nonvolatile memory, in particular, to a 2-cells-per-bit nonvolatile memory structure.

2. Description of Related Art

Nonvolatile memory is widely applied in various electrical apparatus because it can retain information even no power is supplied thereto. According to the limit of programming times, nonvolatile memory is divided into multi-time programmable (MTP) memory and one-time programmable (OTP) memory. MTP is multi-readable and multi-writable. In general, MTP has a single charge storage region for writing and reading information (i.e. 1 cell/bit).

However, as the development of memory structure, the gate oxide under the charge storage region of MTP becomes too thin, and thus the data retention capability may deteriorate when defects occur in the gate oxide. Therefore, there is a need in this industry to improve the data retention characteristics of the nonvolatile memory.

SUMMARY OF THE INVENTION

Accordingly, the present invention is directed to a nonvolatile memory structure with good data retention capability, which has two charge storage regions for writing and reading information (i.e. 2 cells/bit).

According to one embodiment of the invention, a nonvolatile memory structure includes a substrate, a first PMOS transistor, a first floating-gate transistor, a second PMOS transistor, a second floating-gate transistor, a source line, a bit line, a word line, and an erase line. The substrate comprises a first active region, a second active region, and an n-type erase region. The first PMOS transistor and the first floating-gate transistor are on the first active region respectively, wherein the first PMOS transistor includes a first select gate, the first floating-gate transistor includes a first floating gate between the first select gate and the n-type erase region, and the first floating gate includes an extended portion extending on a first portion of the n-type erase region. The second PMOS transistor and the second floating-gate transistor are on the second active region respectively, wherein the second PMOS transistor includes a second select gate, the second floating-gate transistor includes a second floating gate between the second select gate and the n-type erase region, and the second floating gate includes an extended portion extending on a second portion of the n-type erase region. The source line connects with sources of the first and the second PMOS transistors. The bit line connects with drains of the first and the second floating-gate transistors. The word line connects with the first and the second select gates. The erase line connects with the n-type erase region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
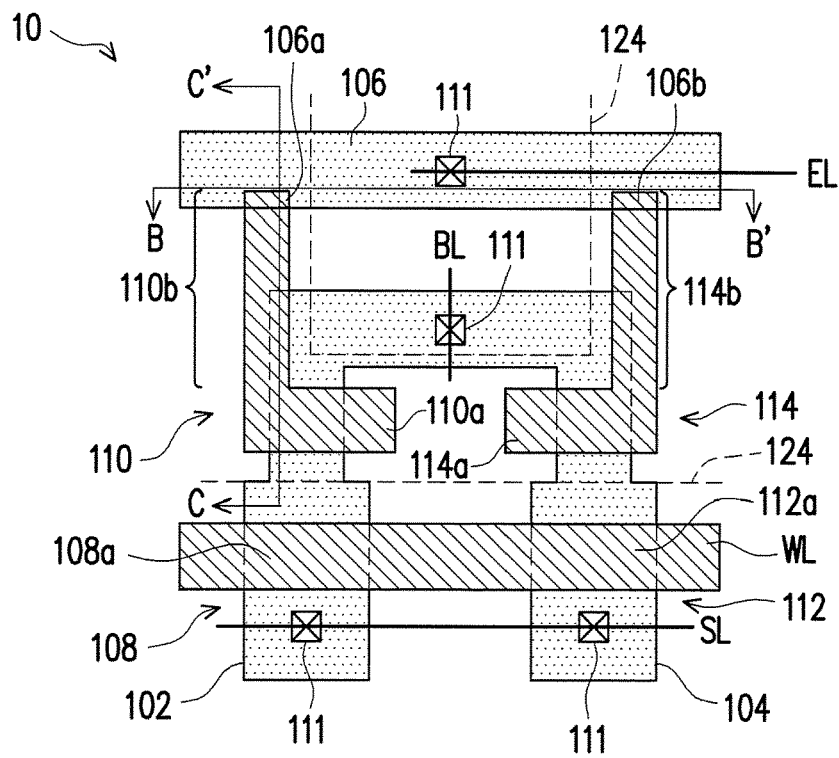
FIG. 1A is a schematic plan view of a layout of a nonvolatile memory structure in accordance with a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
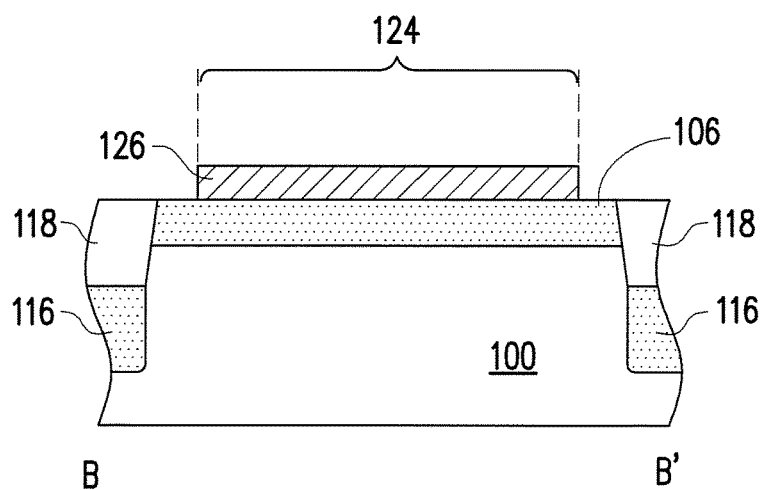
FIG. 1B is a schematic, cross-sectional diagram taken along line B-B' of FIG. 1A.
Figure 1C:
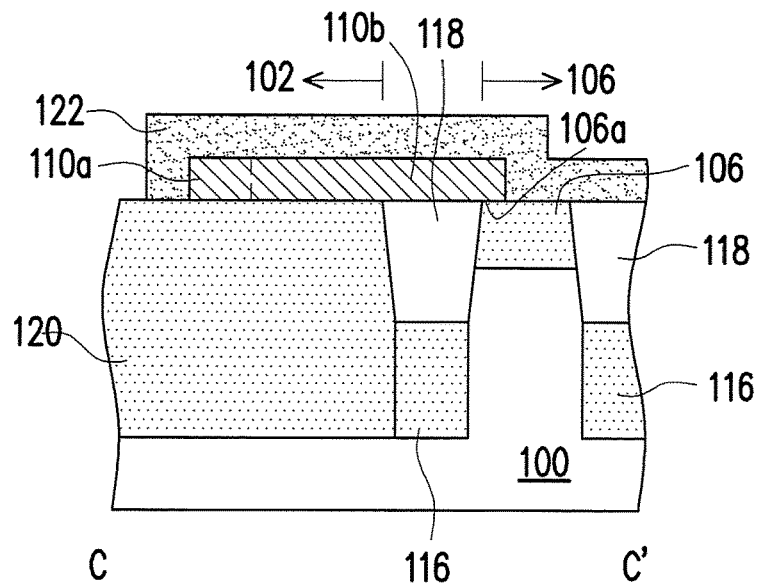
FIG. 1C is one example of a schematic, cross-sectional diagram taken along line C-C' of FIG. 1A.
Figure 1D:
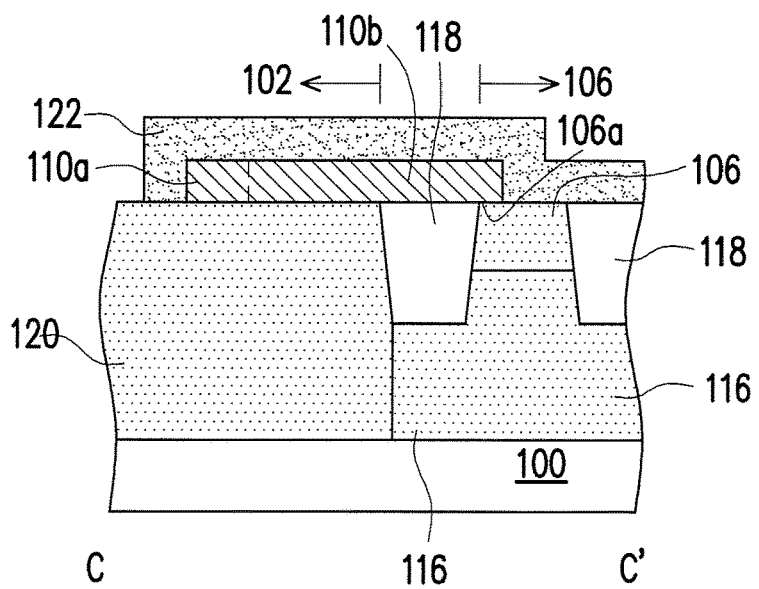
FIG. 1D is another example of a schematic, cross-sectional diagram taken along line C-C' of FIG. 1A.

FIG. 1A is a schematic plan view of a layout of a nonvolatile memory structure in accordance with a first embodiment of this invention. FIG. 1B is a schematic, cross-sectional diagram taken along line B-B' of FIG. 1A. FIG. 1C is one example of a schematic, cross-sectional diagram taken along line C-C' of FIG. 1A. FIG. 1D is another example of a schematic, cross-sectional diagram taken along line C-C' of FIG. 1A.

With reference to FIGS. 1A-1D, a nonvolatile memory structure 10 provided in the first embodiment includes a substrate 100 in which has a first and a second active regions 102, 104 and an n-type erase region 106, a first PMOS transistor 108, a first floating-gate transistor 110, a second PMOS transistor 112, a second floating-gate transistor 114, a source line SL, a bit line BL, a word line WL, and an erase line EL. The substrate 100 is a p-type substrate, for instance. The n-type erase region 106 is insulated from the first active region 102 and the second active region 104, wherein the n-type erase region 106 may be a $n^+$ region surrounded by a p-type well 116 under an insolation structure 118 as shown in FIG. 1C. In addition, the p-type well 116 may be further disposed under the n-type erase region 106 as shown in FIG. 1D.

In FIG. 1A, the first PMOS transistor 108 and the first floating-gate transistor 110 are disposed on the first active region 102 respectively, wherein the first PMOS transistor 108 includes a first select gate (SG1) 108a, and the first floating-gate transistor 110 includes a first floating gate (FG1) 110a between the first select gate 108a and the n-type erase region 106. The first floating gate 110a further includes an extended portion 110b extending on a first portion 106a of the n-type erase region 106, and the extended portion 110b has an extending direction parallel to an extending direction of the first active region 102. The extended portion 110b of the first floating gate 110a overlaps a portion of the first active region 102, for example. The second PMOS transistor 112 and the second floating-gate transistor 114 are disposed on the second active region 104 respectively, wherein the second PMOS transistor 112 includes a second select gate (SG2) 112a, and the second floating-gate transistor 114 includes a second floating gate (FG2) 114a between the second select gate 112a and the n-type erase region 106. The second floating gate 114a further includes an extended portion 114b extending on a second portion 106b of the n-type erase region 106, and the extended portion 114b has an extending direction parallel to an extending direction of the second active region 104. The extended portion 114b of the second floating gate 114a overlaps a portion of the second active region 104, for example. The source line SL connects with sources of the first PMOS transistor 108 and the second PMOS transistor 112 via the contacts 111. The bit line BL connects with drains of the first floating-gate transistor 110 and the second floating-gate transistor 114 via the contact 111. The word line WL connects with the first select gate 108a and the second select gate 112a. The erase line EL connects with the n-type erase region 106 via the contact 111. Since the nonvolatile memory structure 10 is a 2-cells-per-bit structure, the bit failure rate of the memory array can be strongly reduced.

In an embodiment of the disclosure, the first floating gate 110a and the second floating gate 114a are erased by Fowler-Nordheim (FN) tunnelling and programmed by channel hot electron (CHE) program, for example. Moreover, the first active region 102 and the second active region 104 under the bit line may be contacted each other as shown in FIG. 1A; however, the disclosure is not limited thereto.

With reference to FIG. 1C or 1D again, an N well 120 is in the substrate 100 near the p-type well 116, and the extended portion 110b is disposed on the first portion 106a of the n-type erase region 106. In an embodiment of the disclosure, a SAB (salicide blocking) layer 122 may be formed on the first floating gate 110a and the extended portion 110b for improving the data retention capability. As the same reason, the SAB layer 122 is also formed on the second floating gate (114a) and the extended portion (114b) thereof. Therefore, a salicide (self-aligned silicide) layer may be formed in the regions 124 of the nonvolatile memory structure 10 in FIG. 1A.

With reference to FIG. 1B again, the salicide layer 126 is formed in the region 124 in FIG. 1B. Since the cell size may be enlarged due to the SAB layer 122, it is prefer to form the SAB layer 122 on a portion of the word line WL. However, the disclosure is not limited thereto. In the absent of the salicide layer, it is preferable to meet a smaller design rule.

Figure 1E:
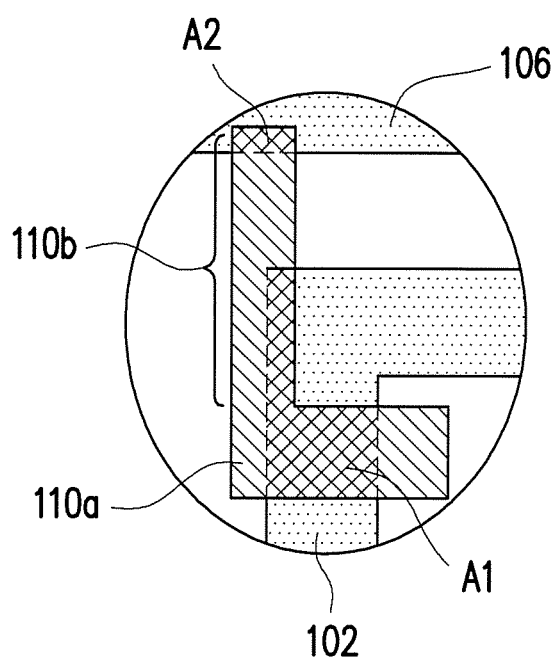
FIG. 1E is an enlarged diagram of the first floating gate in FIG. 1A.

FIG. 1E is an enlarged diagram of the first floating gate in FIG. 1A.

In FIG. 1E, an overlap area between the first floating gate 110a and the first active region 102 is A1, an overlap area between the first floating gate 110a and the n-type erase region 106 is A2, and a ratio of A1 to a sum of A1 and A2 (i.e. A1/(A1+A2)) is, for instance, more than 75% taking into consideration erase efficiency. For example, if A1/(A1+A2) is 90% and A2/(A1+A2) is 10%, when applying a voltage of 10V on the n-type erase region 106 and 0V on the N well (120 as shown in FIG. 1C), a voltage difference from the n-type erase region 106 to the floating gate 110a is 10V−(0V×90%+10V×10%)=9V. Accordingly, during erase operation, the high voltage difference can improve the erase efficiency.

As the same reason, an overlap area between the second floating gate 114a and the second active region 104 is A3, an overlap area between the second floating gate 114a and the n-type erase region 106 is A4, and then a ratio of A3 to a sum of A3 and A4 is preferably more than 75%.

Figure 2:
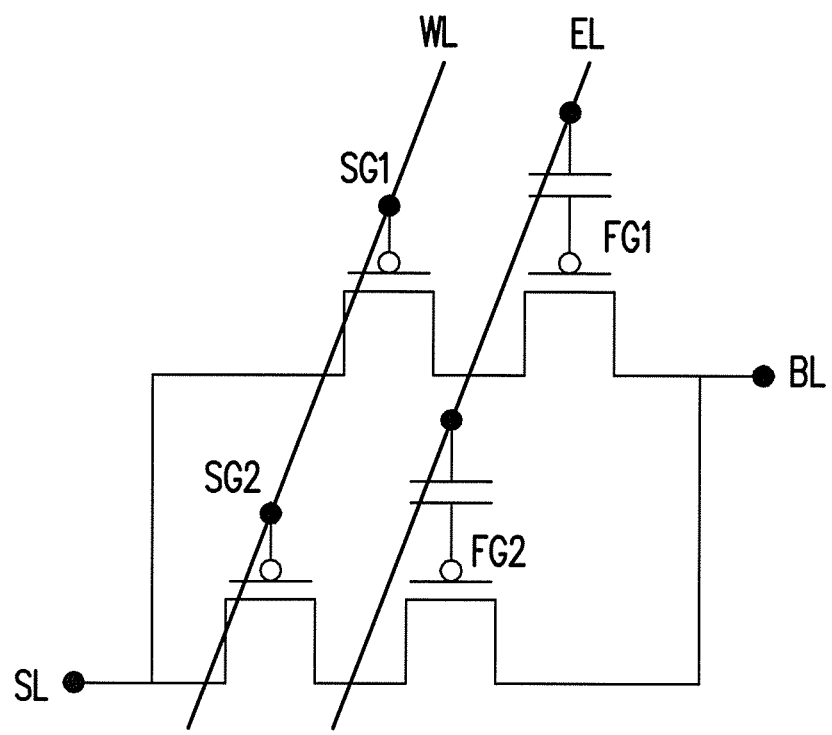
FIG. 2 illustrates the equivalent circuit of the nonvolatile memory structure as set forth in FIG. 1A.

FIG. 2 illustrates the equivalent circuit of the nonvolatile memory structure as set forth in FIG. 1A. It is clear that the source line SL connects with sources of the two PMOS transistors, the bit line BL connects with drains of the two floating-gate transistors, the word line WL connects with the two select gates (SG1 and SG2), and the erase line EL connects with the n-type erase region (i.e. n-type capacitor).

Figure 3:
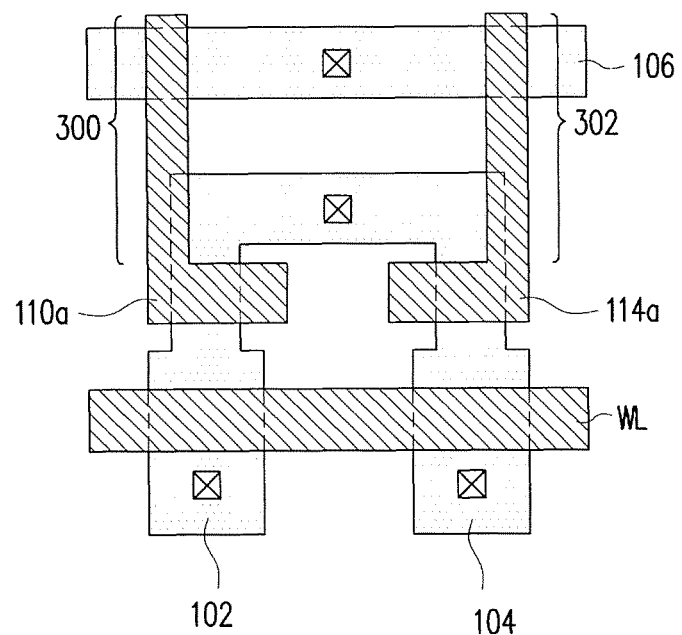
FIGS. 3 and 4 are other schematic plan views of a layout of a nonvolatile memory structure in accordance with the first embodiment of this invention.
Figure 4:
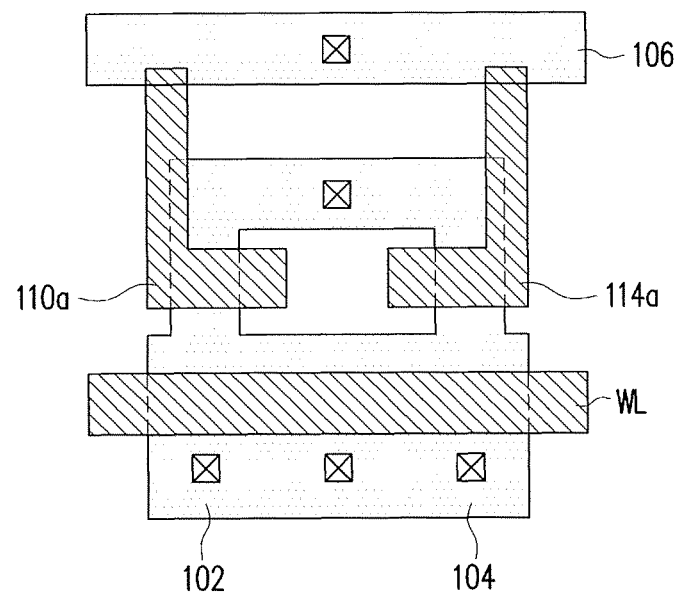

FIGS. 3 and 4 are other schematic plan views of a layout of a nonvolatile memory structure in accordance with the first embodiment of this invention, and some essential elements are not shown for clarification.

With reference to FIG. 3, the extended portions 300 and 302 of the first floating gate 110a and the second floating gate 114a are each independently across the n-type erase region 106, and thus the stability of process may be enhanced.

With reference to FIG. 4, the first active region 102 and the second active region 104 under the word line WL are contacted each other, whereby enlarging width of select gate.

Figure 5:
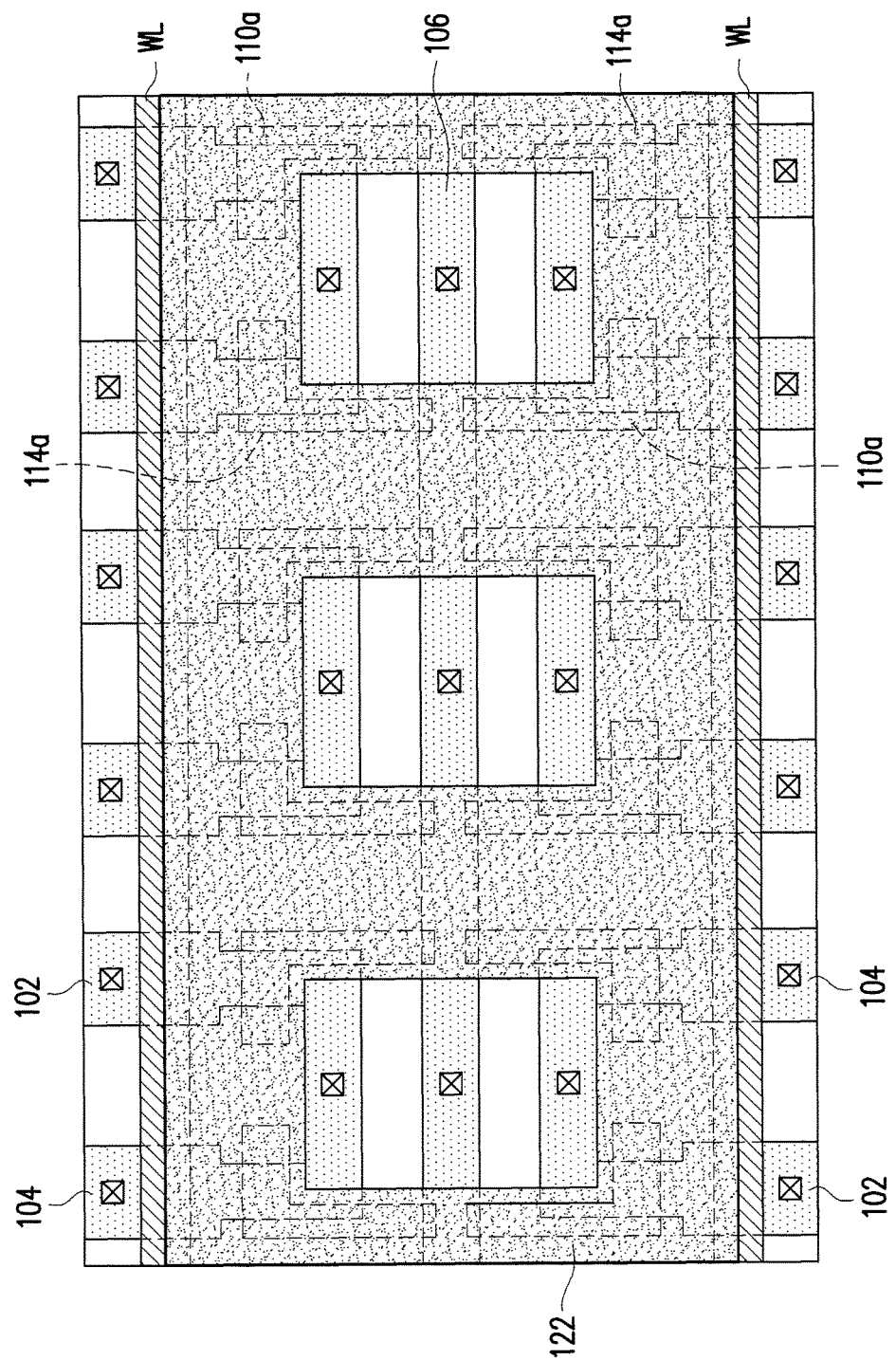
FIG. 5 is a schematic plan view of a layout of an array of the nonvolatile memory structure as set forth in FIG. 1A.

FIG. 5 is a schematic plan view of a layout of an array of the nonvolatile memory structure as set forth in FIG. 1A.

With reference to FIG. 5, there are six nonvolatile memory structures of FIG. 1A, but it is not limited thereto. In an embodiment of the disclosure, the n-type erase region 106 is a common line for the nonvolatile memory structures, and one word line WL can be used in three nonvolatile memory structures. Moreover, the SAB layer 122 is formed on the floating gates 110a and 114a, the extended portions 110b and 114b, and a half of the word line WL, so the salicide layer cannot be formed on the portion of the WL close to the floating gates 110a and 114a. However, the disclosure is not limited thereto. The salicide layer may be omitted.

Since the nonvolatile memory structure of FIG. 1A can be arranged in a NOR-type array, its operation conditions of a selected memory structure may be listed as Table 1.

TABLE 1

|  | BL | SL | NW (N well) | WL | EL | PW (p-type well) |
|---|---|---|---|---|---|---|
| Program | 0 V | VPP | VPP/2 | VPP/2 | 0 V |
| Erase | 0 V | 0 V | 0 V | VEE | 0 V |
| Read | Near GND | Vread | 0 V | 0 V-Vread | 0 V |

In Table 1, the applied voltages may be varied as different process technologies. For example, in 0.13 μm process technologies, the VPP is about 6.5V, the Vread is about 2V, the VEE is about 11V, and it is optionally to perform a pre-charge in the Read operation, so a voltage near GND (e.g. 0.4V) may be applied on the BL. Moreover, the voltage applied to EL in the Read operation may be between 0V and Vread in order to obtain better Ion/Ioff range.

Figure 6A:
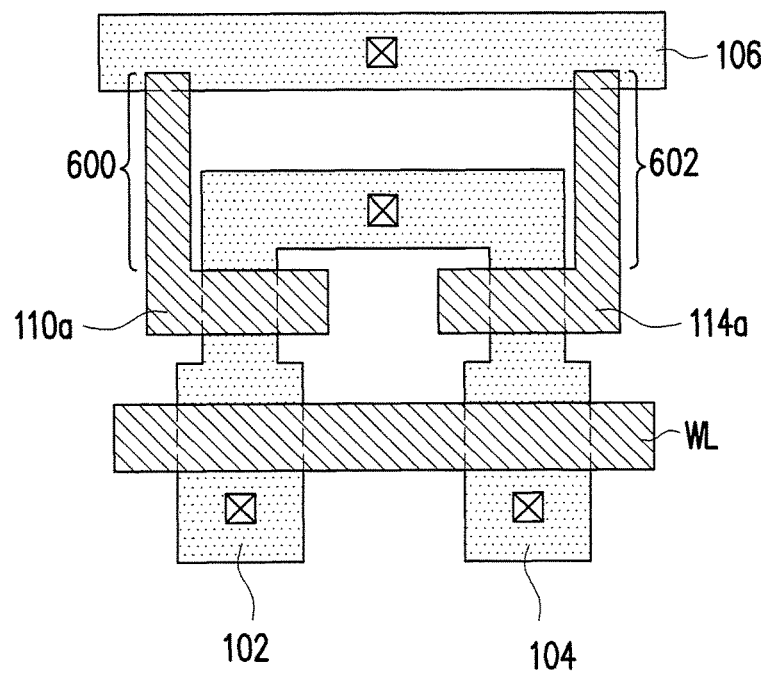
FIG. 6A is a schematic plan view of a layout of a nonvolatile memory structure in accordance with a second embodiment of this invention.

FIG. 6A is a schematic plan view of a layout of a nonvolatile memory structure in accordance with a second embodiment of this invention, and some essential elements are not shown for clarification.

With reference to FIG. 6A, the extended portion 600 of the first floating gate 110a and the extended portion 602 of the second floating gate 114a do not overlap the first and the second active regions 102, 104. In the second embodiment, the extended portions 600 and 602 are disposed outside the first active region 102 and the second active region 104.

Figure 6B:
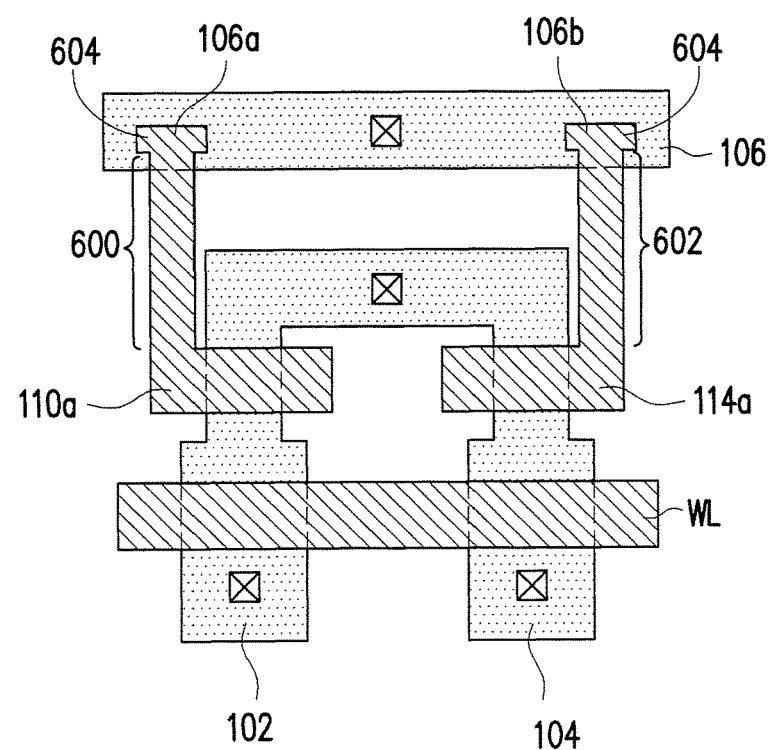
FIGS. 6B and 6C are other schematic plan views of a layout of a nonvolatile memory structure in accordance with the second embodiment of this invention.
Figure 6C:
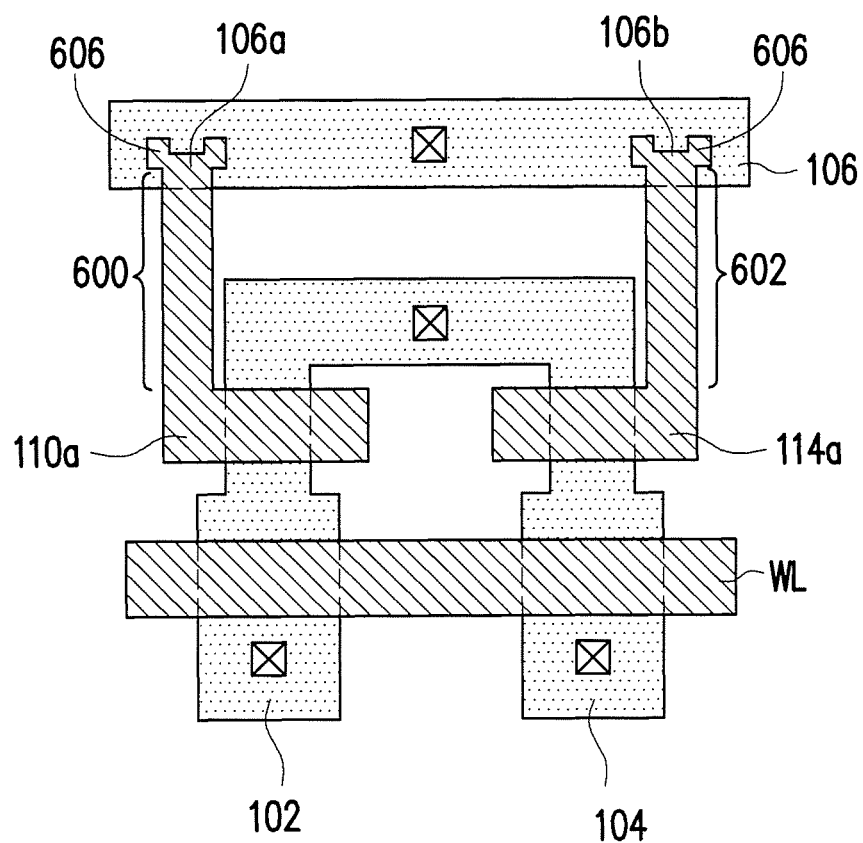

FIGS. 6B and 6C are other schematic plan views of a layout of a nonvolatile memory structure in accordance with the second embodiment of this invention, and some essential elements are not shown for clarification.

With reference to FIGS. 6B and 6C, the extended portion 600 of the first floating gate 110a may include an additional portion such as hammer-shaped portion 604 or ear-shaped portion 606 on the first portion 106a of the n-type erase region 106 by manual OPC. The extended portion 602 of the second floating gate 114a may include an additional portion such as hammer-shaped portion 604 or ear-shaped portion 606 on the second portion 106b of the n-type erase region 106 by manual OPC. Due to the manual OPC, it is helpful to stably form the extended portions 600 and 602, and thus the erase stability may be enhanced.

Figure 7A:
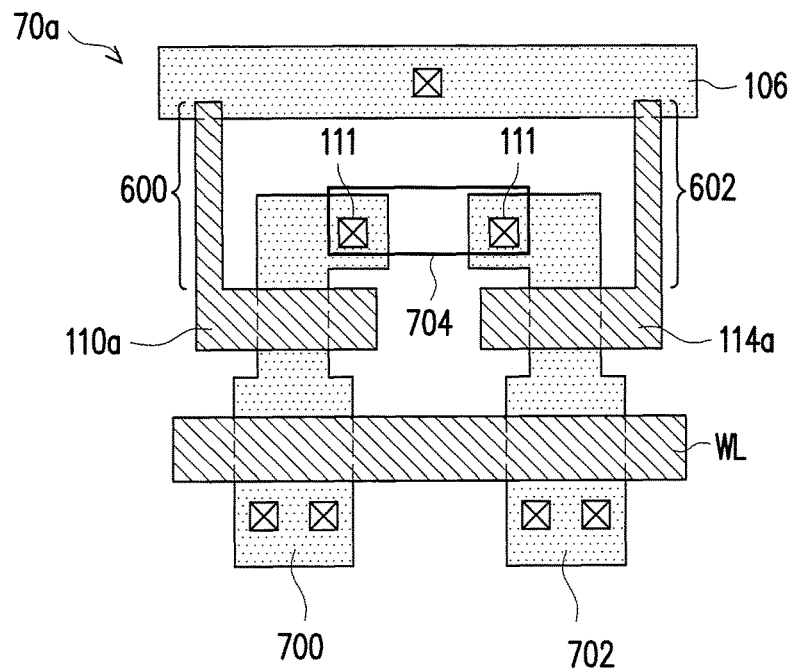
FIGS. 7A and 7B are schematic plan views of a layout of a nonvolatile memory structure in accordance with a third embodiment of this invention.
Figure 7B:
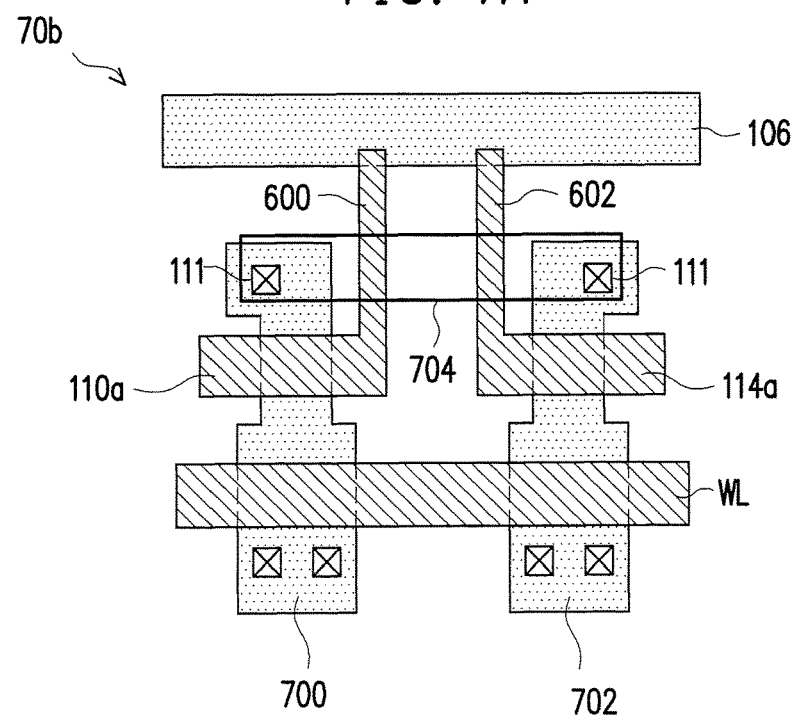

FIGS. 7A and 7B are schematic plan views of a layout of a nonvolatile memory structure in accordance with a third embodiment of this invention, and some essential elements are not shown for clarification.

With reference to FIG. 7A, the nonvolatile memory structure 70a is similar to that of the second embodiment except for the place of the active regions. In the third embodiment, the first active region 700 and the second active region 702 are spaced apart from each other. Preferably, a metal line 704 is disposed to connect the first active region 700 and the second active region 702 via contact 111.

With reference to FIG. 7B, the difference between the nonvolatile memory structure 70a in FIG. 7A with the nonvolatile memory structure 70b is that the extended portions 600 and 602 of the first floating gate 110a and the second floating gate 114a are disposed between the first active region 700 and the second active region 702. Therefore, the poly coupling issue between adjacent cells may be eliminated.

Figure 8:
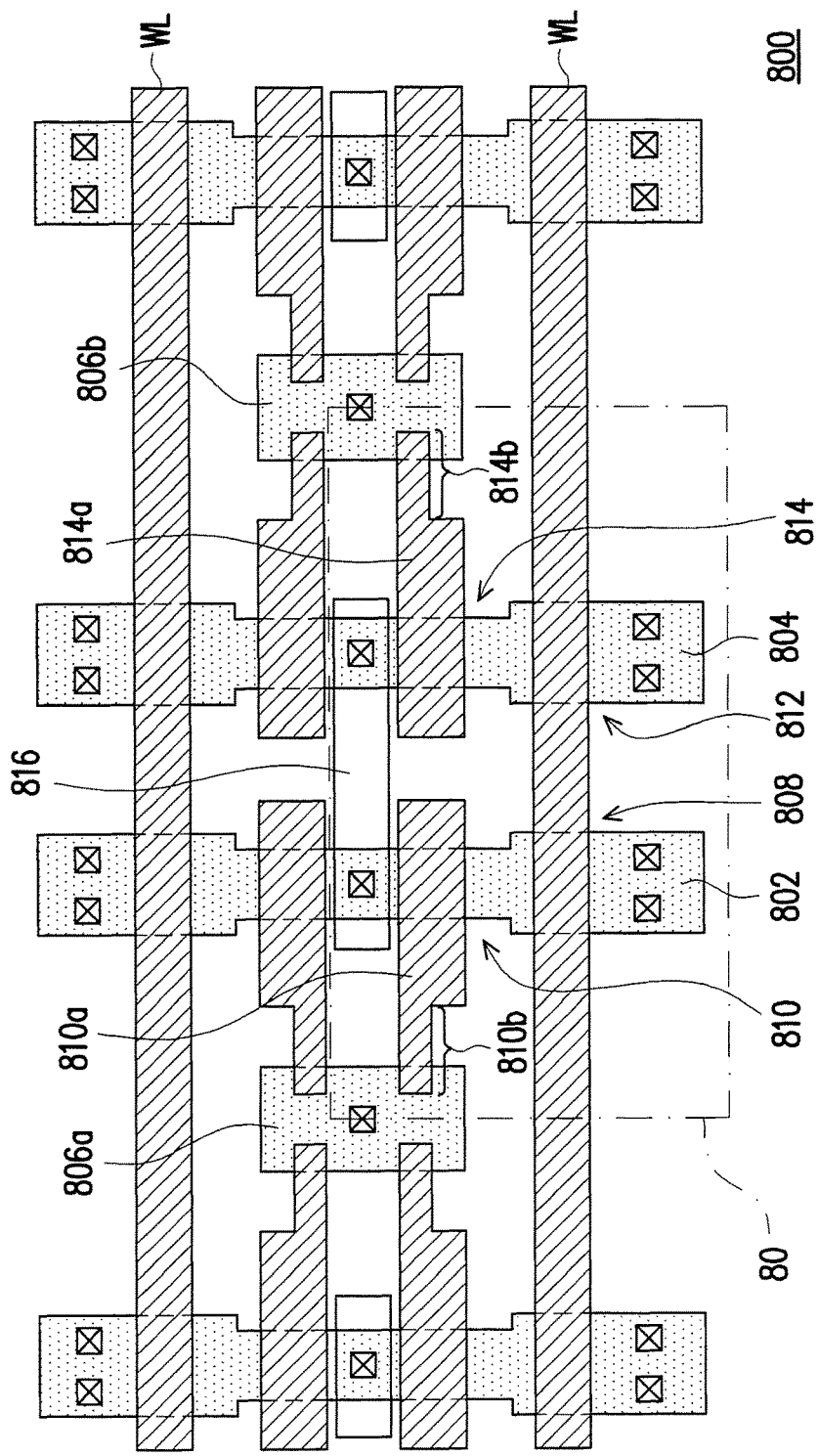
FIG. 8 is a schematic plan view of a layout of an array of a nonvolatile memory structure in accordance with a fourth embodiment of this invention.

FIG. 8 is a schematic plan view of a layout of an array of a nonvolatile memory structure in accordance with a fourth embodiment of this invention, and some essential elements are not shown for clarification.

With reference to FIG. 8, the nonvolatile memory structure 80 provided in the fourth embodiment includes a substrate 800 in which has a first and a second active regions 802 and 804 and two isolated n-type erase regions 806a and 806b, a first PMOS transistor 808, a first floating-gate transistor 810, a second PMOS transistor 812, a second floating-gate transistor 814, a metal line 816 and a word line WL. The source line SL, the erase line EL and the bit line BL are not shown, but they are constructed to meet the equivalent circuit in FIG. 2. For example, the bit line BL may be M2 (second layer of metal layer in layout), and the erase line EL may be M3 (third layer of metal layer in layout).

In the fourth embodiment, the metal line 816 connects the first and second active regions 802 and 804. The extended portion 810b of the first floating gate 810a extends on the isolated n-type erase region 806a, and the extended portion 814b of the second floating gate 814a extends on the isolated n-type erase region 806b. The extended portion 810b has an extending direction perpendicular to an extending direction of the first active region 802. The extended portion 814b has an extending direction perpendicular to an extending direction of the second active region 804.

Figure 9:
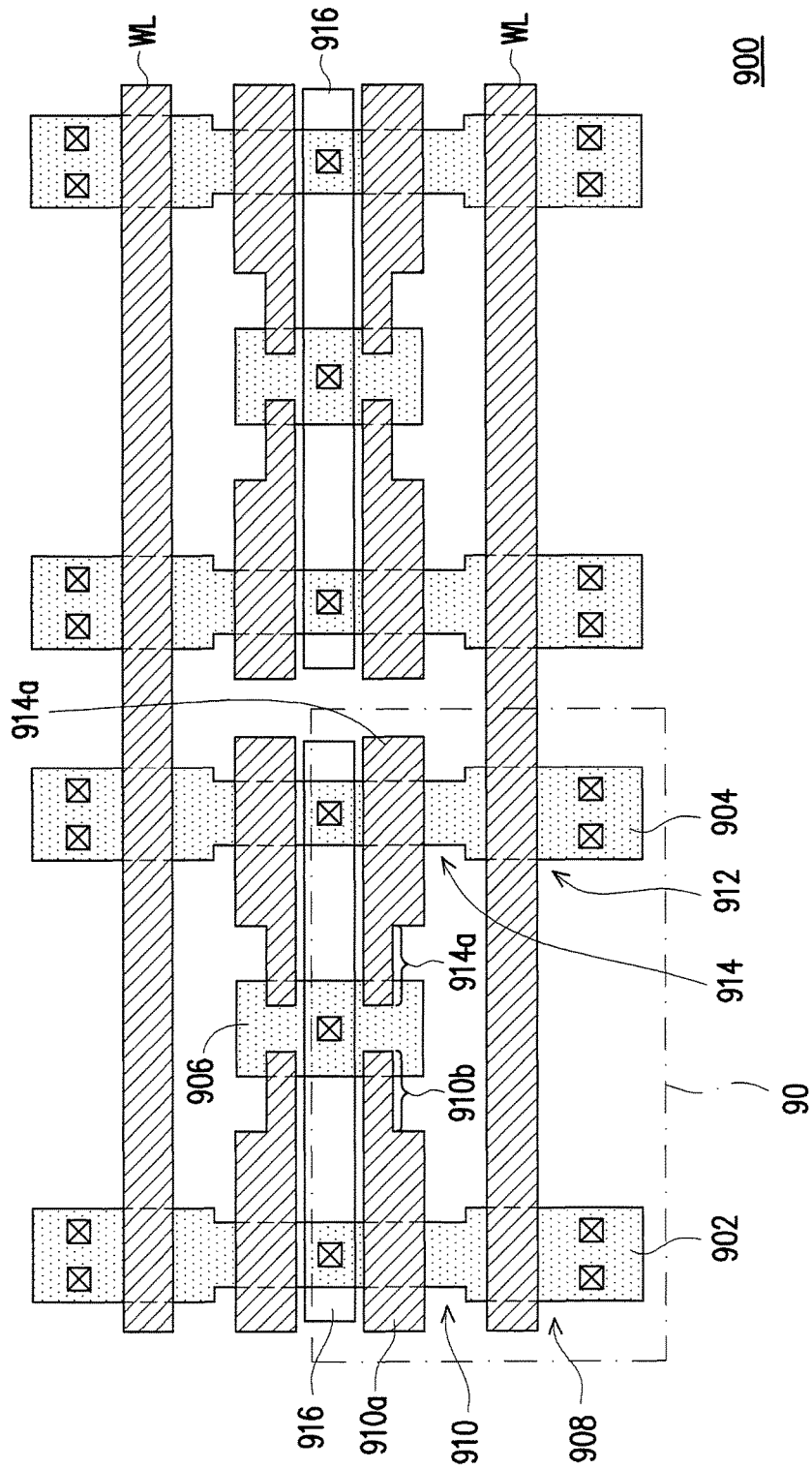
FIG. 9 is a schematic plan view of a layout of an array of a nonvolatile memory structure in accordance with a fifth embodiment of this invention.

FIG. 9 is a schematic plan view of a layout of an array of a nonvolatile memory structure in accordance with a fifth embodiment of this invention, and some essential elements are not shown for clarification.

With reference to FIG. 9, the nonvolatile memory structure 90 provided in the fifth embodiment includes a substrate 900 in which has a first and a second active regions 902 and 904 and an n-type erase region 906, a first PMOS transistor 908, a first floating-gate transistor 910, a second PMOS transistor 912, a second floating-gate transistor 914, a metal line 916 and a word line WL. The source line SL, the erase line EL and the bit line BL are not shown, but they are constructed according to the equivalent circuit in FIG. 2.

In the fifth embodiment, the metal line 916 connects the first and second active regions 902 and 904. Both the extended portion 910b of the first floating gate 910a and the extended portion 914b of the second floating gate 914a extend on the n-type erase region 906. The extended portion 910b has an extending direction perpendicular to an extending direction of the first active region 902. The extended portion 914b has an extending direction perpendicular to an extending direction of the second active region 904. It is known that if one cell is failure, the other cell close to the failure cell may be failure easily. Hence, since the first PMOS transistor 908 is far away from the second PMOS transistor 912, the bit failure rate of the memory array can be further reduced. In the array of FIG. 9, it is clear that two of the nonvolatile memory structures 90 share one of the n-type erase regions 906.

In summary, the nonvolatile memory structures of the above embodiments feature in reducing read failure rate and enhancing data retention capability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A 2-cells-per-bit nonvolatile memory structure, comprising:
 a substrate comprising a first active region, a second active region, and an n-type erase region, wherein the n-type erase region is insulated from the first active region and the second active region;

a first PMOS transistor and a first floating-gate transistor on the first active region respectively, wherein the first PMOS transistor includes a first select gate and a first source, the first floating-gate transistor includes a first drain and a first floating gate between the first select gate and the n-type erase region, the first floating gate comprises an extended portion extending on a first portion of the n-type erase region, and the extended portion of the first floating gate has an extending direction parallel to an extending direction of the first active region;

a second PMOS transistor and a second floating-gate transistor on the second active region respectively, wherein the second PMOS transistor includes a second select gate and a second source, the second floating-gate transistor includes a second drain and a second floating gate between the second select gate and the n-type erase region, the second floating gate comprises an extended portion extending on a second portion of the n-type erase region, and the extended portion of the second floating gate has an extending direction parallel to an extending direction of the second active region;

a source line connecting with the first source of the first PMOS transistor and the second source of the second PMOS transistor;

a bit line connecting with the first drain of the first floating-gate transistor and the second drain of the second floating-gate transistor;

a word line connecting with the first select gate and the second select gate; and an erase line connecting with the n-type erase region.

2. The nonvolatile memory structure according to claim 1, wherein the first floating gate and the second floating gate are erased by Fowler-Nordheim (FN) tunnelling.

3. The nonvolatile memory structure according to claim 1, wherein the first floating gate and the second floating gate are programmed by channel hot electron (CHE) program.

4. The nonvolatile memory structure according to claim 1, further comprising a p-type well surrounding the n-type erase region.

5. The nonvolatile memory structure according to claim 1, further comprising a p-type well under and surrounding the n-type erase region.

6. The nonvolatile memory structure according to claim 1, further comprising a salicide blocking (SAB) layer on each of the first floating gate and the second floating gate.

7. The nonvolatile memory structure according to claim 1, wherein an overlap area between the first floating gate and the first active region is A1, an overlap area between the first floating gate and the n-type erase region is A2, and a ratio of A1 to a sum of A1 and A2 is more than 75%.

8. The nonvolatile memory structure according to claim 1, wherein an overlap area between the second floating gate and the second active region is A3, an overlap area between the second floating gate and the n-type erase region is A4, and a ratio of A3 to a sum of A3 and A4 is more than 75%.

9. The nonvolatile memory structure according to claim 1, further comprising an additional portion in the extended portion of the first floating gate on the first portion of the n-type erase region.

10. The nonvolatile memory structure according to claim 1, further comprising an additional portion in the extended portion of the second floating gate on the second portion of the n-type erase region.

11. The nonvolatile memory structure according to claim 1, wherein the extended portions of the first floating gate and the second floating gate are each independently across the n-type erase region.

12. The nonvolatile memory structure according to claim 1, wherein the first active region and the second active region under the word line are in contact with each other.

13. The nonvolatile memory structure according to claim 1, wherein the first active region and the second active region under the bit line are in contact with each other.

14. The nonvolatile memory structure according to claim 1, wherein the first active region and the second active region are spaced apart from each other.

15. The nonvolatile memory structure according to claim 1, wherein the extended portion of the first floating gate overlaps a portion of the first active region.

16. The nonvolatile memory structure according to claim 1, wherein the extended portion of the second floating gate overlaps a portion of the second active region.

17. The nonvolatile memory structure according to claim 1, wherein the extended portions of the first floating gate and the second floating gate are disposed between the first active region and the second active region.

18. The nonvolatile memory structure according to claim 1, wherein the extended portions of the first floating gate and the second floating gate are disposed outside the first active region and the second active region.

19. The nonvolatile memory structure according to claim 1, wherein the n-type erase region comprises two isolated regions, the extended portion of the first floating gate extends on one of the isolated regions, and the extended portion of the second floating gate extends on another of the isolated regions.

20. The nonvolatile memory structure according to claim 1, wherein the extended portion of the first floating gate has an extending direction parallel to an extending direction of the first active region.

21. The nonvolatile memory structure according to claim 1, wherein the extended portion of the first floating gate has an extending direction perpendicular to an extending direction of the first active region.

22. The nonvolatile memory structure according to claim 1, wherein the extended portion of the second floating gate has an extending direction parallel to an extending direction of the second active region.

23. The nonvolatile memory structure according to claim 1, wherein the extended portion of the second floating gate has an extending direction perpendicular to an extending direction of the second active region.

24. An array comprising a plurality of nonvolatile memory structures according to claim 1, in which two of the nonvolatile memory structures share one of the n-type erase regions.

* * * * *